(12) United States Patent
Shen et al.

(10) Patent No.: US 8,779,484 B2
(45) Date of Patent: Jul. 15, 2014

(54) IMAGE SENSOR AND PROCESS THEREOF

(71) Applicant: United Microelectronics Corp., Hsin-Chu (TW)

(72) Inventors: Xu Yang Shen, Singapore (SG); Seng Wah Liau, Singapore (SG); Yuheng Liu, Singapore (SG); Qin Li, Singapore (SG); Kiet Houng Chow, Singapore (SG)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/688,216

(22) Filed: Nov. 29, 2012

(65) Prior Publication Data

US 2014/0145282 A1    May 29, 2014

(51) Int. Cl.
*H01L 31/062*    (2012.01)

(52) U.S. Cl.
USPC .............................. 257/294; 438/73; 438/78

(58) Field of Classification Search
USPC ....................................... 438/73, 78; 257/294
See application file for complete search history.

(56) References Cited

U.S. PATENT DOCUMENTS

| | | |
|---|---|---|
| 3,930,295 A | 1/1976 | Rose |
| 4,148,048 A | 4/1979 | Takemoto |
| 4,460,912 A | 7/1984 | Takeshita |
| 4,533,624 A | 8/1985 | Sheppard |
| 4,644,172 A | 2/1987 | Sandland |
| 4,745,451 A | 5/1988 | Webb |
| 4,951,104 A | 8/1990 | Kato |
| 5,070,380 A | 12/1991 | Erhardt |
| 5,241,417 A | 8/1993 | Sekiguchi |
| 5,246,803 A | 9/1993 | Hanrahan |
| 5,294,288 A | 3/1994 | Melpolder |
| 5,321,297 A | 6/1994 | Enomoto |
| 5,466,926 A | 11/1995 | Sasano |
| 5,587,696 A | 12/1996 | Su |
| 5,625,210 A | 4/1997 | Lee |
| 5,650,864 A | 7/1997 | Tseng |
| 5,830,624 A | 11/1998 | Bae |
| 5,880,495 A | 3/1999 | Chen |
| 5,977,535 A | 11/1999 | Rostoker |
| 6,006,764 A | 12/1999 | Chu |
| 6,071,826 A | 6/2000 | Cho |
| 6,081,018 A | 6/2000 | Nakashiba |
| 6,087,211 A | 7/2000 | Kalnitsky |
| 6,124,200 A | 9/2000 | Wang |
| 6,171,885 B1 | 1/2001 | Fan |

(Continued)

OTHER PUBLICATIONS

Murakami, Technologies to Improve Photo-Sensitivity and Reduce VOD Shutter Voltage for CCD Image Sensors, IEEE Transactions on Electron Devices, vol. 47, No. 8, Aug. 2000.

*Primary Examiner* — Trung Q Dang
(74) *Attorney, Agent, or Firm* — Winston Hsu; Scott Margo (57) ABSTRACT

An image sensor includes a plurality of color filters and an anti-reflective layer. The color filters are located on a substrate. The anti-reflective layer is located between the substrate and the color filters, and parts of the anti-reflective layer corresponding to at least two of the color filters have different thicknesses. Moreover, an image sensing process including the following steps is also provided. An anti-reflective layer is formed on a substrate. A plurality of color filters is formed on the anti-reflective layer, wherein parts of the anti-reflective layer right below at least two of the color filters have different thicknesses.

20 Claims, 6 Drawing Sheets

(56) References Cited

U.S. PATENT DOCUMENTS

| | | |
|---|---|---|
| 6,294,313 B1 | 9/2001 | Kobayashi |
| 6,297,160 B1 | 10/2001 | Chien |
| 6,338,976 B1 | 1/2002 | Huang |
| 6,352,876 B1 | 3/2002 | Bordogna |
| 6,369,417 B1 | 4/2002 | Lee |
| 6,376,797 B1 | 4/2002 | Piwczyk |
| 6,388,278 B1 | 5/2002 | Suzuki |
| 6,407,415 B2 | 6/2002 | Lee |
| 6,433,844 B2 | 8/2002 | Li |
| 6,482,669 B1 | 11/2002 | Fan |
| 6,514,810 B1 | 2/2003 | Kim |
| 6,566,151 B2 | 5/2003 | Yeh |
| 6,617,189 B1 | 9/2003 | Chen et al. |
| 6,632,700 B1 | 10/2003 | Fan |
| 6,641,464 B1 | 11/2003 | Steere, III |
| 6,664,191 B1 | 12/2003 | Kim |
| 6,730,555 B2 | 5/2004 | Kim |
| 6,794,215 B2 | 9/2004 | Park |
| 6,821,809 B2 | 11/2004 | Abe |
| 6,841,848 B2 | 1/2005 | MacNamara |
| 6,846,722 B2 | 1/2005 | Lee |
| 6,849,533 B2 | 2/2005 | Chang |
| 6,872,584 B2 | 3/2005 | Nakashiba |
| 6,921,934 B2 | 7/2005 | Patrick |
| 6,933,972 B2 | 8/2005 | Suzuki |
| 6,953,608 B2 | 10/2005 | Leu |
| 6,960,512 B2 | 11/2005 | Cheng |
| 7,006,294 B2 | 2/2006 | Steenblik |
| 7,078,779 B2 | 7/2006 | Wang |
| 7,115,924 B1 | 10/2006 | LaMaster |
| 7,129,172 B2 | 10/2006 | Morrow |
| 7,180,044 B2 | 2/2007 | Yu |
| 7,199,439 B2 | 4/2007 | Farnworth |
| 7,229,745 B2 | 6/2007 | Lamarre |
| 7,315,359 B2 | 1/2008 | Hong |
| 7,328,915 B2 | 2/2008 | Smith |
| 7,498,190 B2 | 3/2009 | Kao |
| 7,531,884 B2 | 5/2009 | Kim |
| 7,648,851 B2 | 1/2010 | Fu |
| 7,772,664 B2 * | 8/2010 | Min ............................ 257/432 |
| 2001/0023086 A1 | 9/2001 | Park |
| 2004/0122328 A1 | 6/2004 | Wang |
| 2005/0024520 A1 | 2/2005 | Yamamoto |
| 2005/0103983 A1 | 5/2005 | Yamaguchi |
| 2005/0121599 A1 | 6/2005 | Mouli |
| 2005/0186739 A1 | 8/2005 | Wang |
| 2005/0247963 A1 | 11/2005 | Chen |
| 2005/0274988 A1 | 12/2005 | Hong |
| 2005/0274996 A1 | 12/2005 | Iwawaki |
| 2006/0054946 A1 | 3/2006 | Baek |
| 2006/0124833 A1 | 6/2006 | Toda |
| 2006/0146230 A1 | 7/2006 | Joon |
| 2006/0146412 A1 | 7/2006 | Kim |
| 2006/0172451 A1 | 8/2006 | Park |
| 2006/0183265 A1 | 8/2006 | Oh |
| 2006/0231898 A1 | 10/2006 | Jeong |
| 2007/0010042 A1 | 1/2007 | Li |
| 2007/0012970 A1 | 1/2007 | Mouli |
| 2007/0018073 A1 | 1/2007 | Hsu |
| 2007/0023851 A1 | 2/2007 | Hartzell |
| 2007/0031988 A1 | 2/2007 | Agranov |
| 2007/0052050 A1 | 3/2007 | Dierickx |
| 2007/0072326 A1 | 3/2007 | Zheng |
| 2007/0096173 A1 | 5/2007 | Kim |
| 2007/0117253 A1 | 5/2007 | Hsu |
| 2007/0158772 A1 | 7/2007 | Boettiger |
| 2007/0166649 A1 | 7/2007 | Yu |
| 2007/0202696 A1 | 8/2007 | Inuiya |
| 2007/0262364 A1 | 11/2007 | Hsu |
| 2008/0036020 A1 | 2/2008 | Ko |
| 2008/0055733 A1 | 3/2008 | Lim |
| 2008/0079103 A1 | 4/2008 | Liao |
| 2008/0121805 A1 | 5/2008 | Tweet |
| 2008/0121951 A1 | 5/2008 | Kao |
| 2008/0157144 A1 | 7/2008 | Lee |
| 2008/0169546 A1 | 7/2008 | Kwon |
| 2008/0265348 A1 | 10/2008 | Maas |
| 2009/0066954 A1 | 3/2009 | Opsal |
| 2009/0121264 A1 | 5/2009 | Kao |
| 2009/0124037 A1 | 5/2009 | Yu |
| 2009/0127643 A1 | 5/2009 | Lu |
| 2009/0134484 A1 | 5/2009 | Lin |
| 2009/0168181 A1 | 7/2009 | Su |
| 2009/0200585 A1 | 8/2009 | Nozaki |
| 2009/0212335 A1 | 8/2009 | Kao |
| 2009/0256258 A1 | 10/2009 | Kreupl |
| 2009/0294888 A1 | 12/2009 | Tsai |
| 2009/0321862 A1 | 12/2009 | Yu |
| 2010/0003623 A1 | 1/2010 | Liu |
| 2010/0038688 A1 | 2/2010 | Wu |
| 2010/0044813 A1 | 2/2010 | Wu |
| 2010/0096359 A1 | 4/2010 | Shiu |
| 2010/0144156 A1 | 6/2010 | Shih |
| 2010/0159632 A1 | 6/2010 | Rhodes |
| 2010/0315734 A1 | 12/2010 | Wu |
| 2011/0057277 A1 | 3/2011 | Yu |
| 2011/0108705 A1 * | 5/2011 | Izuha et al. ............... 250/208.1 |
| 2012/0033119 A1 * | 2/2012 | Shinohara .................. 348/302 |
| 2013/0069190 A1 * | 3/2013 | Kao et al. ..................... 257/432 |

* cited by examiner

IMAGE SENSOR AND PROCESS THEREOF

BACKGROUND OF THE INVENTION

1. Field of the Invention

The present invention relates generally to an image sensor and a process thereof, and more specifically to an image sensor and a process thereof that has an anti-reflective layer having different thicknesses corresponding to each color filters.

2. Description of the Prior Art

CMOS image sensors (CIS) are based on CMOS technologies, so the CMOS image sensors are compatible with typical CMOS fabrication processes. They are an integration of additional signal processing logic elements on the same substrate, wherein disposing a sensor array is permitted. Thus, CMOS image sensors (CIS) are widely used.

The CIS system traditionally uses the Front Side Illumination (FSI) technology to form pixels of a pixel array. In FSI CMOS image sensors, light is transmitted to a photo-sensing area through the front side of the pixel. This means that the incident light has to first pass through dielectric layers, and metal layers before it reaches the photo-sensing area, thereby causing a low quantum efficiency (QE), serious cross talks between pixels, and dark current.

Another type of CMOS image sensor is the BSI (Back Side illumination) CMOS type of image sensors. Instead of illuminating a CMOS image sensor from the top (front) side of the silicon die, a BSI CMOS image sensor uses color filters and microlenses on the back side of the pixels so that the incident light is collected from the back side of the image sensor. Compared to the FSI CMOS image sensors, the BSI CMOS image sensors have lower light losses, reduced crosstalks, and better quantum efficiency.

A conventional back side illumination (BSI) image sensor may be divided by function into a light sensing area and a peripheral electronic circuit area. The light sensing area has a plurality of photodiodes arranged in an array, and MOS transistors to sense light intensity, i.e. a reset transistor, a current source follower and a row selector. The peripheral electronic circuit area connects interconnects to external connections. A main function of the back side illumination (BSI) image sensor is to divide incident beams into combinations of light of different wavelengths. The light is received by a plurality of imaging devices on the semiconductor substrate and transformed into digital signals of different intensities. For instance, an incident beam is divided into a combination of red, green and blue light and received by corresponding photodiodes. Each photodiode transforms the light intensity into digital signals.

SUMMARY OF THE INVENTION

The present invention provides an image sensor and process thereof, which forms an anti-reflective layer having different thicknesses to improve the anti-reflectivity of the anti-reflective layer, thereby improving the optical transmission of the image sensor and the light sensing sensitivity of the image sensor in specific wave bands.

The present invention provides an image sensor including a plurality of color filters and an anti-reflective layer. The color filters are located on a substrate. The anti-reflective layer is located between the substrate and the color filters, and parts of the anti-reflective layer corresponding to at least two of the color filters have different thicknesses.

The present invention provides an image sensing process including the following steps. An anti-reflective layer is formed on a substrate. A plurality of color filters is formed on the anti-reflective layer, wherein parts of the anti-reflective layer right below at least two of the color filters have different thicknesses.

According to the above, the present invention provides an image sensor and a process thereof, which forms an anti-reflective layer between a substrate and color filters, and parts of the anti-reflective layer corresponding to at least two of the color filters have different thicknesses. Therefore, the anti-reflective layer of the present invention, compared to an anti-reflective layer with a single thickness, has a better anti-reflectivity, thereby improving the performances of the image sensor such as the optical transmission and the sensing sensitivity of light in specific wave bands.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
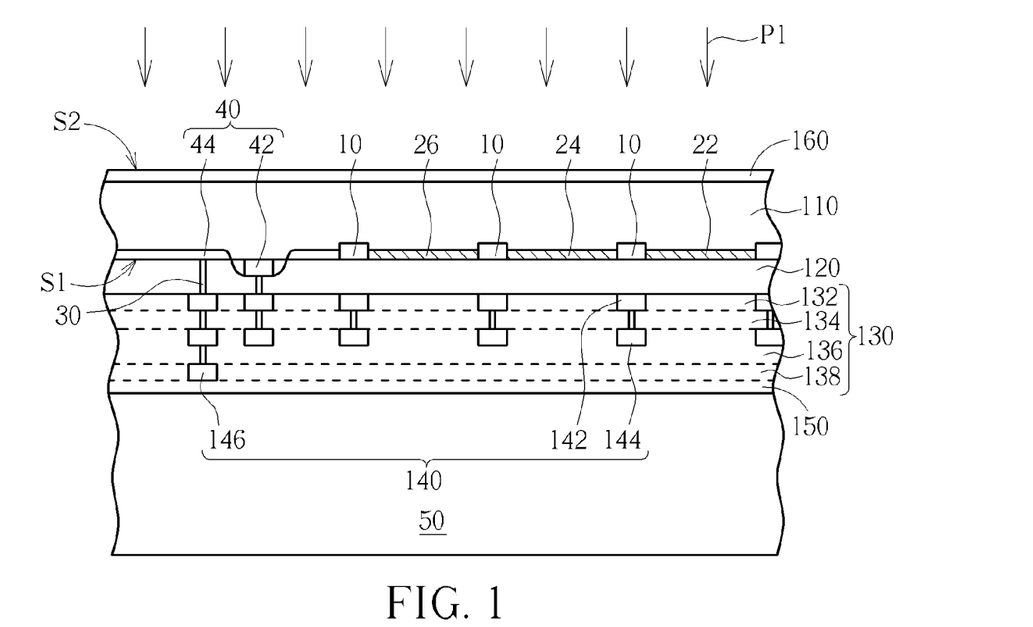
FIGS. 1-5 schematically depict cross-sectional views of an image sensing process according to a first embodiment of the present invention.

FIGS. 1-5 schematically depict cross-sectional views of an image sensing process according to a first embodiment of the present invention. As shown in FIG. 1, a previous process of an image sensing process including the following steps is performed. A substrate 110 having a front side S1 and a back side S2 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A plurality of isolation structures 10 are formed on the front side S1 of the substrate 110, wherein the isolation structure 10 may be a shallow trench isolation structure, which may be formed by a shallow trench isolation process, but not limited thereto. Then, a plurality of sensing areas, such as photodiodes 22, 24, 26 arranged as a matrix, is formed between each of the isolation structures 10 to receive incident light; and at least a MOS transistor 40 is formed, which may be a reset transistor, a current source follower or a row selector used to transform the sensing beams into digital signals, a logical MOS transistor in the periphery circuit region, but not limited thereto. A dielectric layer 120 is entirely formed on the front side S1 of the substrate 110. The dielectric layer 120 may be an interdielectric layer, which may be an oxide layer, but it is not limited thereto. Contact holes (not shown) are formed in the dielectric layer 120 through etching, and conductive materials, such as copper or tungsten, are filled into the contact holes (not shown) to form contact plugs 30 respectively connecting a gate 42 and a source/drain 44 of the MOS transistor 40. To specify and clarify the present invention, there are just three photodiodes 22, 24, 26 and one MOS transistor 40 described in this embodiment, but the number of the photodiodes 22, 24, 26 and the MOS transistor 40 are not limited thereto. Besides, other semiconductor components may also be disposed on the substrate 110 and in the dielectric layer 120. For example, other interconnect structures or other elements (not shown) may also be disposed in the dielectric layer 120, but they are not described here one by one.

A multilayer intermetal dielectric (IMD) 130 and a multilayer metal layer 140 are formed. In details, the multilayer inter metal dielectric (IMD) 130 may include multi-layers of patterned dielectric layer 132, 134, 136, 138 and multi-layers of patterned metal layer 142, 144, 146. The processing steps for forming the multilayer inter metal dielectric (IMD) 130 and the multilayer metal layer 140 may include the following steps. A deposition and a planarization process are carried out to entirely form a dielectric layer (not shown) on the interdielectric layer 120; the dielectric layer (not shown) is etched to form the patterned dielectric layer 132; metal (not shown) is filled into the patterned dielectric layer 132 to form the metal layer 142 in the patterned dielectric layer 132; then, said steps are performed repeatedly to form a stacked structure including multi-layers of patterned dielectric layer 132, 134, 136, 138 and multi-layers of patterned metal layer 142, 144, 146. The patterned dielectric layer 132, 134, 136, 138 may be oxide layers, and the patterned metal layer 142, 144, 146 may be metal layers composed of copper or aluminum etc, but it is not limited thereto. An isolating layer 150 is formed to entirely cover the multilayer inter metal dielectric (IMD) 130 and the multilayer metal layer 140. The isolating layer 150 may be an oxide layer or a nitride layer, but it is not limited thereto.

As shown in FIG. 1, the structure is disposed reversely, and the isolating layer 150 is disposed on a loading wafer 50. Then, the substrate 110 is thinned down from the back side S2 of the substrate 110. A doping process P1 may be selectively performed on the back side S2 of the substrate 110, so that a doping layer 160 is formed.

Figure 2:
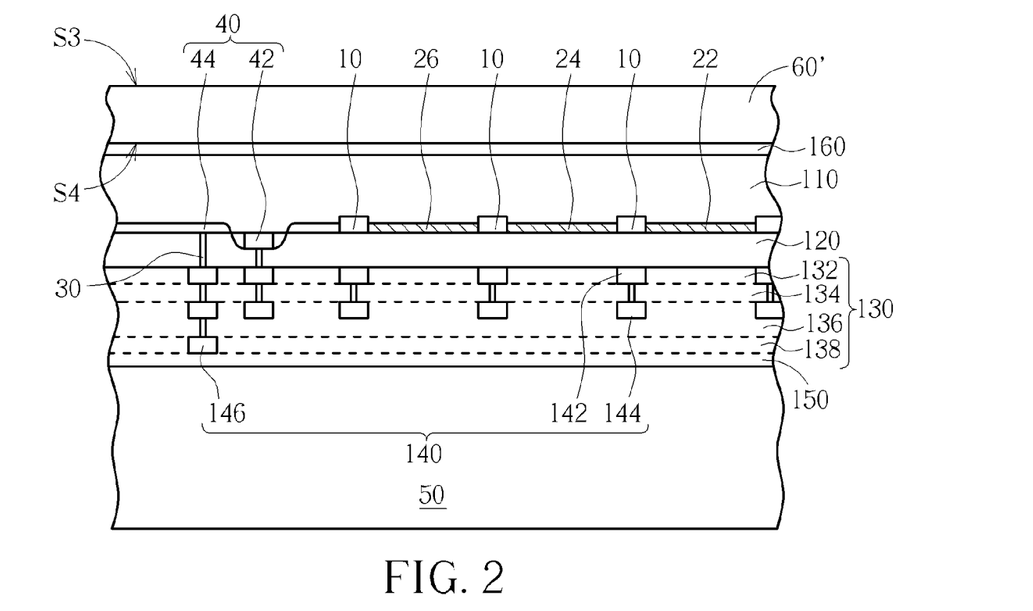

As shown in FIG. 2, an oxide layer (not shown) may be selectively formed on the doping layer 160, so that dark current can be reduced by reducing surface defects. An anti-reflective layer 60' is formed on the doping layer 160 (or the oxide layer (not shown)), wherein the anti-reflective layer 60' has a top surface S3 and a bottom surface S4. The anti-reflective layer 60' may include a silicon nitride (SiN) layer, a silicon carbide (SiC) layer, a carbon-doped silicon nitride (SiCN) layer, a silicon oxynitride (SiON) layer or an organic material layer etc. The material of the anti-reflective layer 60' can be chosen to fit a suitable refractive index (RI) according to the wave band of the light passing the anti-reflective layer 60', but it is not limited thereto.

Figure 3:
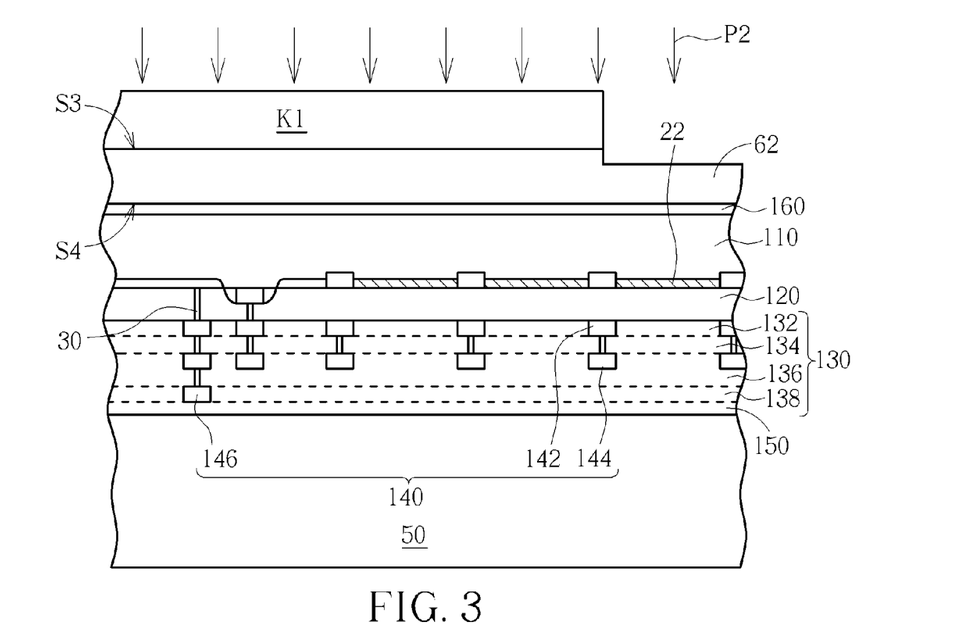

As shown in FIG. 3, a photoresist (not shown) is formed to entirely cover the anti-reflective layer 60', and the photoresist (not shown) is patterned to form a patterned photoresist K1, and a part of the anti-reflective layer 62 right above the photodiode 22 is therefore exposed. An etching process P2 is performed to etch the exposed part of the anti-reflective layer 62. Then, the patterned photoresist K1 is removed, so that an anti-reflective layer 60 is formed as shown in FIG. 4, wherein the bottom surface S4 of the anti-reflective layer 60 is a flat surface, while the top surface of part of the anti-reflective layer 62 corresponding to the other parts of the anti-reflective layer 60 is a concave surface, so that the anti-reflective layer 60 corresponding to different sensing areas has different thicknesses d1 and d2, and the thickness d2 is thinner than the thickness d1.

Figure 5:
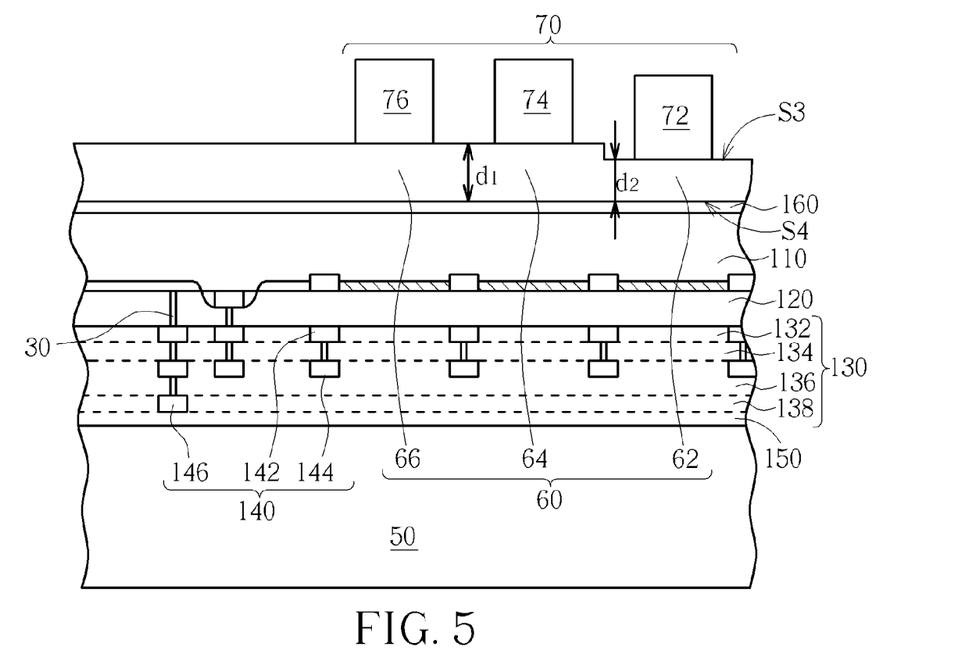

As shown in FIG. 5, a plurality of color filters 70 may be sequentially formed on the anti-reflective layer 60. In this embodiment, three color filters 70 (blue, green and red filters) are formed on the anti-reflective layer 60; in another embodiment, a different number of color filters, or filters with other color series may also be formed, depending upon the practical needs. More precisely, the color filters 70 may be a blue filter 72, a green filter 74 and a red filter 76, and the thickness d2 of part of the anti-reflective layer 62 right below the blue filter 72 is a quarter of the wavelength of the blue light, and the thickness d1 of part of the anti-reflective layer 64, 66 right below the green filter 74 and the red filter 76 is a quarter of the wavelength between green light wavelength and red light wavelength. Compared to an anti-reflective layer merely having a single thickness d2 being a quarter of blue light wavelength, the anti-reflective layer 60 of this embodiment can increase the anti-reflectivity in the wave band of green light and red light by 5%. Since the green light wavelength and the red light wavelength are closer to each other than to the blue light wavelength, the thickness d1 of a part of the anti-reflective layer 64 right blow the green filter 74 is the same as the thickness d1 of the part of the anti-reflective layer 66 right below the red filter 76 in this embodiment in order to simplify the processing steps and improve the anti-reflectivity of the anti-reflective layer 60 as well.

In this embodiment, the thickness d2 of the part of the anti-reflective layer 62 right below the blue filter 72 is a quarter of the wavelength of blue light, and the thickness d1 of the part of the anti-reflective layer 64, 66 right below the green filter 74 and the red filter 76 is a quarter of the wavelength between the green light wavelength and the red light wavelength; in another embodiment, the thickness d2 of the part of the anti-reflective layer 62 right below the blue filter 72 may be three-quarters or five-quarters of the wavelength of the blue light, or so to say: a quarter of the wavelength plus n times half of the wavelength of the blue light (where n is a positive integer), and the thickness d1 of the part of the anti-reflective layer 64, 66 right below the green filter 74 and the red filter 76 may be three-quarters or five-quarters of the wavelength between the green light wavelength and the red light wavelength, or so to say: a quarter of the wavelength plus n times half of the wavelength between the green light wavelength and the red light wavelength (where n is a positive integer), and the purpose of the present invention can be achieved. Due to the thinner anti-reflective layer 60 that can increase the light penetration, the thicknesses of each of the parts of the anti-reflective layer 62, 64, 66 are preferred to be a quarter of the wavelength of a maximum intensity light penetrating through the anti-reflective layer 62, 64, 66.

Figure 4:
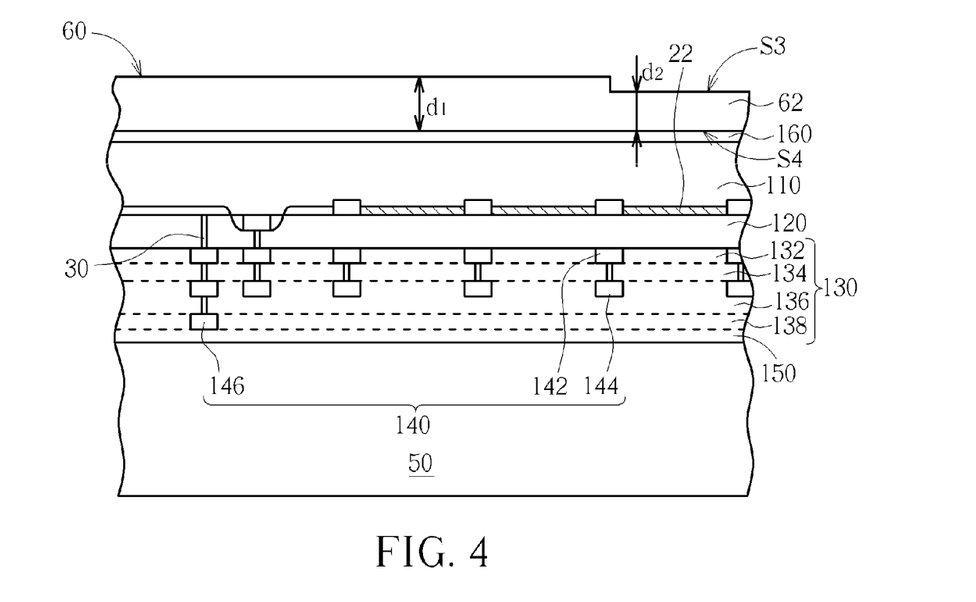

In another embodiment, after the anti-reflective layer 60 having different thicknesses d1 and d2 is formed as shown in FIG. 4, other etching processes may be performed to change the thicknesses of the anti-reflective layer 60 right below the green filter 74 and the red filter 76 to further improve the anti-reflectivity of the anti-reflective layer 60.

Figure 6:
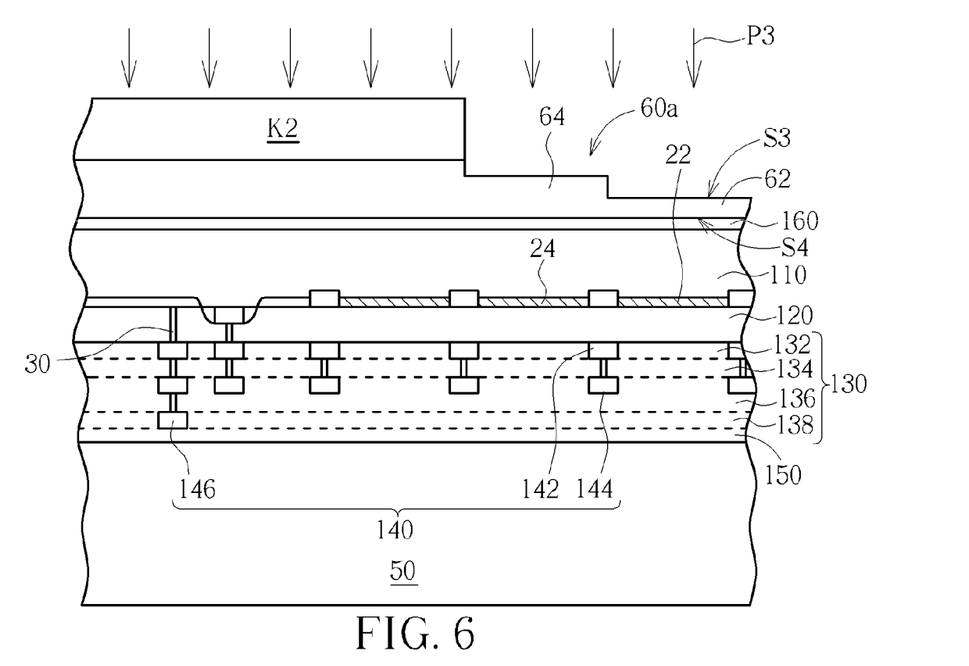
FIGS. 6-8 schematically depict cross-sectional views of an image sensing process according to a second embodiment of the present invention.
Figure 7:
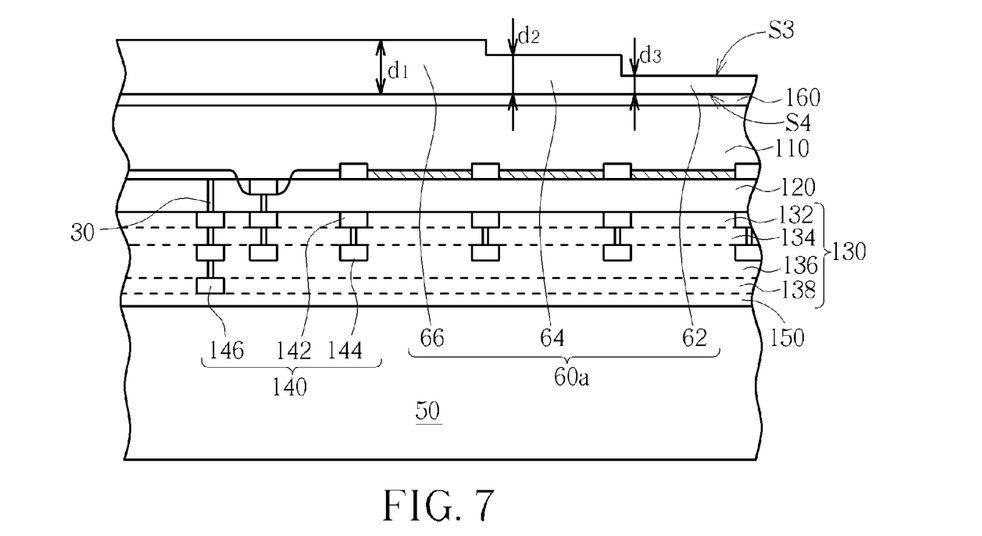
Figure 8:
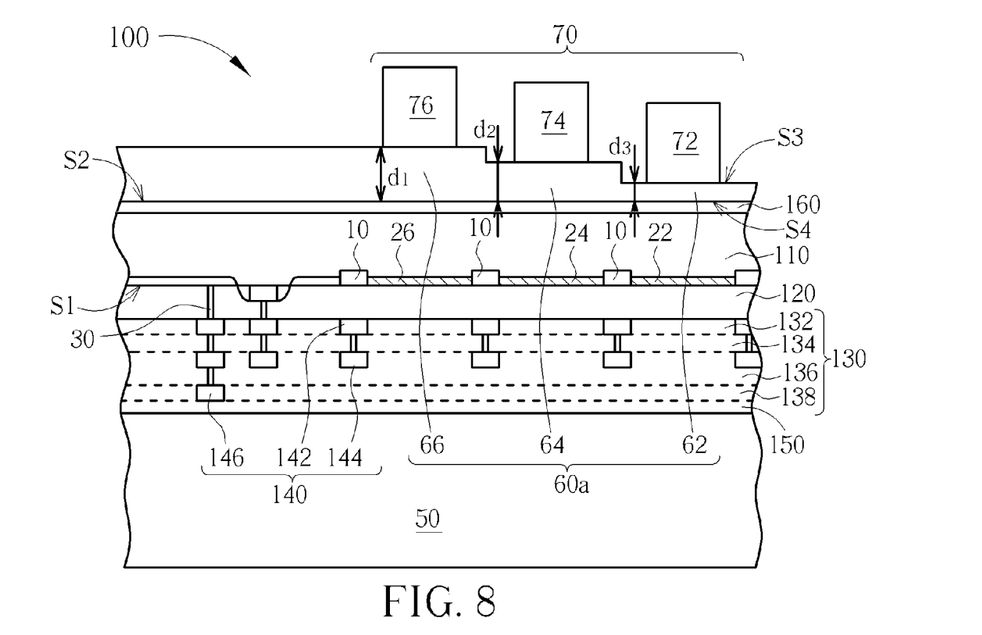

FIGS. 6-8 schematically depict cross-sectional views of an image sensing process according to a second embodiment of the present invention. After the steps of FIG. 4 are completed, a photoresist (not shown) is formed to entirely cover the anti-reflective layer 60 and the photoresist (not shown) is patterned to form a patterned photoresist K2, therefore parts of the anti-reflective layer 62, 64 right above the photodiodes 22, 24 are exposed, as shown in FIG. 6. An etching process P3 is performed to etch the exposed parts of the anti-reflective layers 62, 64. The patterned photoresist K2 is then removed as shown in FIG. 7, meaning that an anti-reflective layer 60a is formed, wherein the bottom surface S4 of the anti-reflective layer 60a is a flat surface, and the top surface of the parts of the anti-reflective layers 62, 64 corresponding to the other parts are a concave surface, so that the anti-reflective layer 60a corresponding to different sensing areas has different thicknesses d1, d2, d3 wherein the thickness d3 is thinner than the thickness d2, and the thickness d2 is thinner than the thickness d1.

Figure 9:
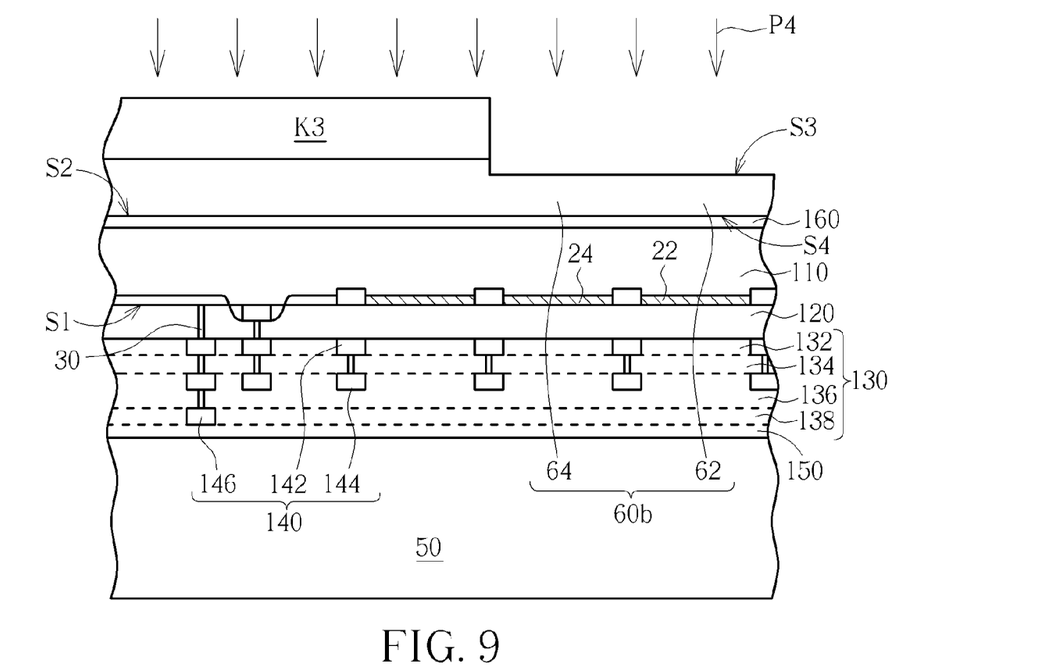
FIGS. 9-10 schematically depict cross-sectional views of an image sensing process according to a third embodiment of the present invention.
Figure 10:
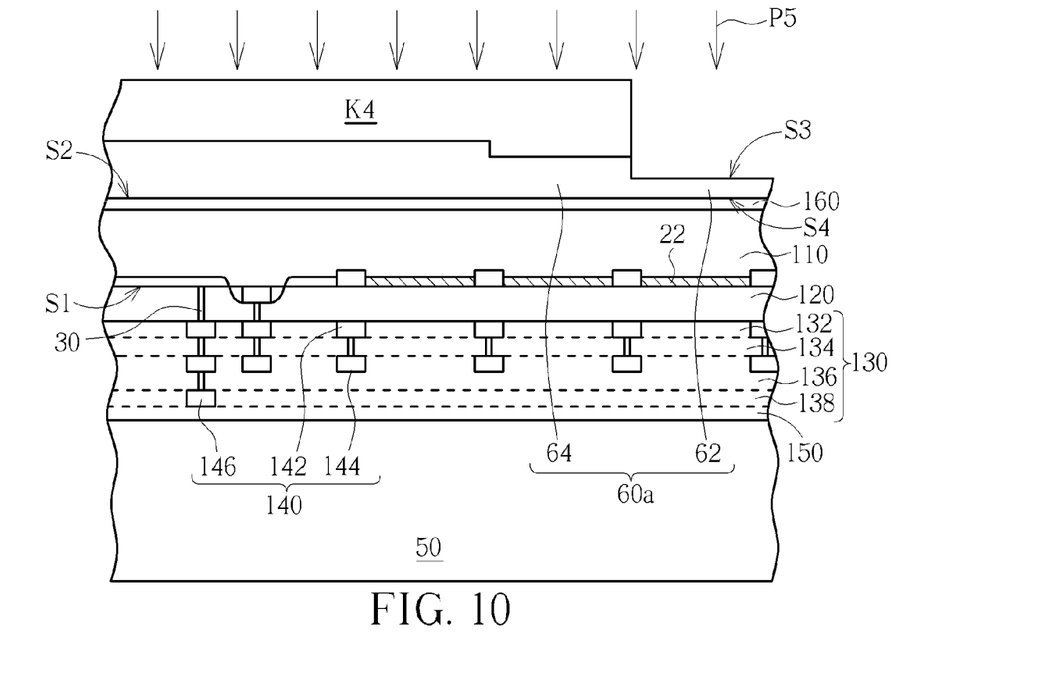

Moreover, the structure formed through the steps of FIGS. 3-4, and FIGS. 6-7 in the second embodiment can be replaced by that described in FIGS. 9-10. FIGS. 9-10 schematically depict cross-sectional views of an image sensing process according to a third embodiment of the present invention. After the steps of forming the anti-reflective layer 60' in FIG. 2 are completed, a photoresist (not shown) is formed to entirely cover the anti-reflective layer 60' and the photoresist (not shown) is patterned to form a patterned photoresist K3, wherein parts of the anti-reflective layers 62, 64 right above the photodiodes 22, 24 are therefore exposed. An etching process P4 is performed to etch the exposed part of the anti-reflective layers 62, 64, so that an anti-reflective layer 60b is formed, as shown in FIG. 9. The patterned photoresist K3 is then removed. As shown in FIG. 10, a photoresist (not shown) is formed to entirely cover the anti-reflective layer 60b and the photoresist (not shown) is patterned to form a patterned photoresist K4, therefore a part of the anti-reflective layer 62 right above the photodiodes 22 is exposed. An etching process P5 is performed to etch the exposed part of the anti-reflective layer 62, so that the anti-reflective layer 60a is formed. The patterned photoresist K4 is then removed. By doing this, the structure formed in the second embodiment can also be formed. Moreover, other processes may also be performed to form the structure of the second embodiment, but they are not described herein.

After the structure of the second or the third embodiment is formed, a plurality of color filters 70 is formed on the anti-reflective layer 60a, as shown in FIG. 8. In this embodiment, three color filters (blue, green and red) are formed on the anti-reflective layer 60a; in another embodiment, a different number of color filters, or filters with other color series may also be formed, depending upon the needs. More specifically, the color filters 70 are a blue filter 72, a green filter 74 and a red filter 76. The thickness d3 of the part of the anti-reflective layer 62 right below the blue filter 72 is a quarter of wavelength of the blue light, the thickness d2 of part of the anti-reflective layer 64 right below the green filter 74 is a quarter of wavelength of the green light, and the thickness d1 of part of the anti-reflective layer 66 right below the red filter 76 is a quarter of wavelength of the red light. Compared to an anti-reflective layer having merely a single thickness d3, the anti-reflectivity in the wave band of the green light can be increased by 5% and by 10% in the wave band of the red light by applying the anti-reflective layer 60a of this embodiment.

In this embodiment, the thickness d3 of the part of the anti-reflective layer 62 right below the blue filter 72 is a quarter of the wavelength of the blue light, the thickness d2 of the part of the anti-reflective layer 64 right below the green filter 74 is a quarter of the wavelength of the green light, and the thickness d3 of the part of the anti-reflective layer 66 right below the red filter 76 is a quarter of the wavelength of the red light; in another embodiment, the thickness d3 of the part of the anti-reflective layer 62 right below the blue filter 72 is three-quarters or five-quarters of the wavelength of the blue light, the thickness d2 of the part of the anti-reflective layer 64 right below the green filter 74 is three-quarters or five-quarters of the wavelength of the green light, and the thickness d3 of the part of the anti-reflective layer 66 right below the red filter 76 is three-quarters or five-quarters of the wavelength of the red light, so as to achieve the purpose of the present invention. Due to the thinner anti-reflective layer 60a that can increase the light penetration, the thicknesses of each part of the anti-reflective layers 62, 64, 66 are preferred to be a quarter of the wavelength of the maximum intensity light penetrating the parts of the anti-reflective layers 62, 64, 66.

A flat layer (not shown) may be selectively formed on each of the color filters 70. A microlens (not shown) is respectively formed on each of the color filters 70 or the flat layer (not shown) to concentrate the incident light emitting into each of the color filters 70. Thereafter, a passivation layer (not shown) may be selectively formed on each of the microlenses (not shown), and later semiconductor processes, such as external electrical connecting processes, may be performed. This means that a back side illumination (BSI) image sensor 100 can be completed.

It is worth noting that, as the thicknesses of the parts of the anti-reflective layers 62, 64, 66 right below each of the color filters 70 are a quarter, three-quarters or five-quarters of the wavelength of the maximum intensity light penetrating through each of the color filters 70, each part of the anti-reflective layers 62, 64, 66 can have better anti-reflectivity. Therefore, by designing the thicknesses of at least one part of the anti-reflective layers 62, 64, 66 right below each of the color filters 70 as a quarter, three-quarters or five-quarters of the wavelength of the maximum intensity light penetrating through each of the color filters 70 in the present invention, better anti-reflectivity can be approached. Moreover, the anti-reflective layers 60, 60a of the first, the second and the third embodiments have two or three thicknesses, but the anti-reflective layers may have four or more than four thicknesses, depending upon numbers, kinds, standards and performances of the color filters.

In one case, the thickness d3 of the part of the anti-reflective layer 62 right below the blue filter 72 is preferably 100/RIa+/−15%; the thickness d2 of the part of the anti-reflective layer 64 right below the green filter 74 is preferably 137.5/RIb+/−10%; the thickness d3 of the part of the anti-reflective layer 66 right below the red filter 76 is preferably 162.5/RIc+/−10%, wherein RIa, RIb, RIc respectively represent the refractive index (RI) of an anti-reflective layer in the waveband of blue light, green light and red light. As the refractive index (RI) of an anti-reflective layer in a wavelength of 400 nanometers is 3.5, the thickness d3 is preferably (400*¼)/3.5=28.57 nanometers; as the refractive index (RI) of an anti-reflective layer in a wavelength of 550 nanometers is 2.4, the thickness d2 is preferably (550*¼)/2.4=57.29 nanometers; and so on.

Compared to an anti-reflective layer having a single thickness, the anti-reflective layer 60, 60a of the present invention can have better anti-reflectivity, and the back side illumination (BSI) image sensor 100 formed by the anti-reflective layer 60, 60a having different thicknesses can have better light penetration and light sensing sensitivity in specific wave bands. In the first, the second and the third embodiments, the anti-reflective layer 60, 60a is formed, which has a top surface S3 and a bottom surface S4, and the bottom surface S4 is a flat surface while a part of the top surface S3 is a concave surface, so that the anti-reflective layer 60, 60a has different thicknesses. Moreover, a fourth embodiment is presented in the following, which forms an anti-reflective layer having a top surface and a bottom surface, and the top surface is a flat surface while a part of the bottom surface is a concave surface.

Figure 11:
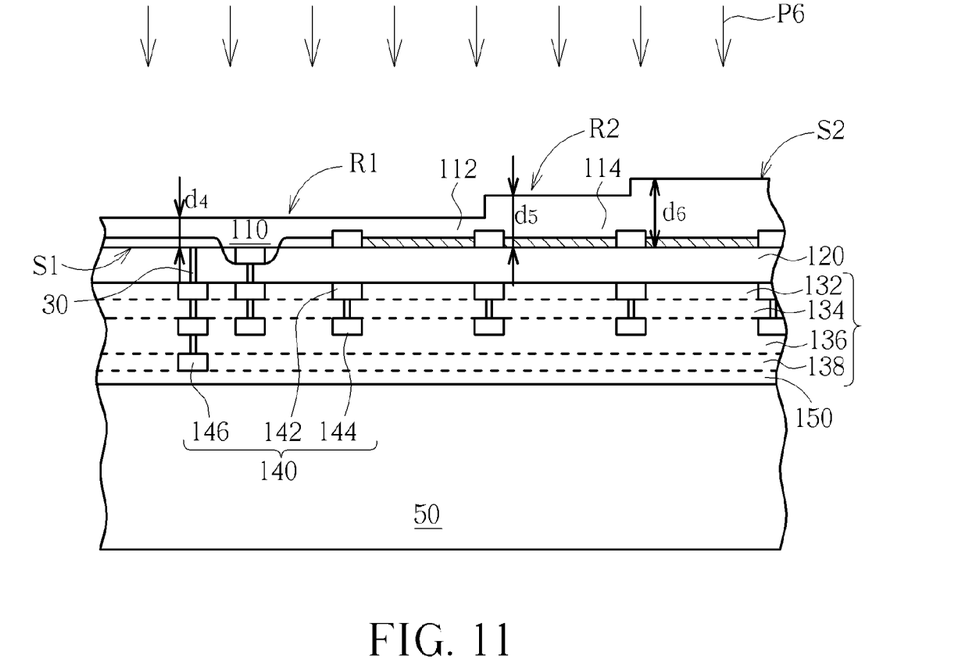
FIGS. 11-12 schematically depict cross-sectional views of an image sensing process according to a forth embodiment of the present invention.
Figure 12:
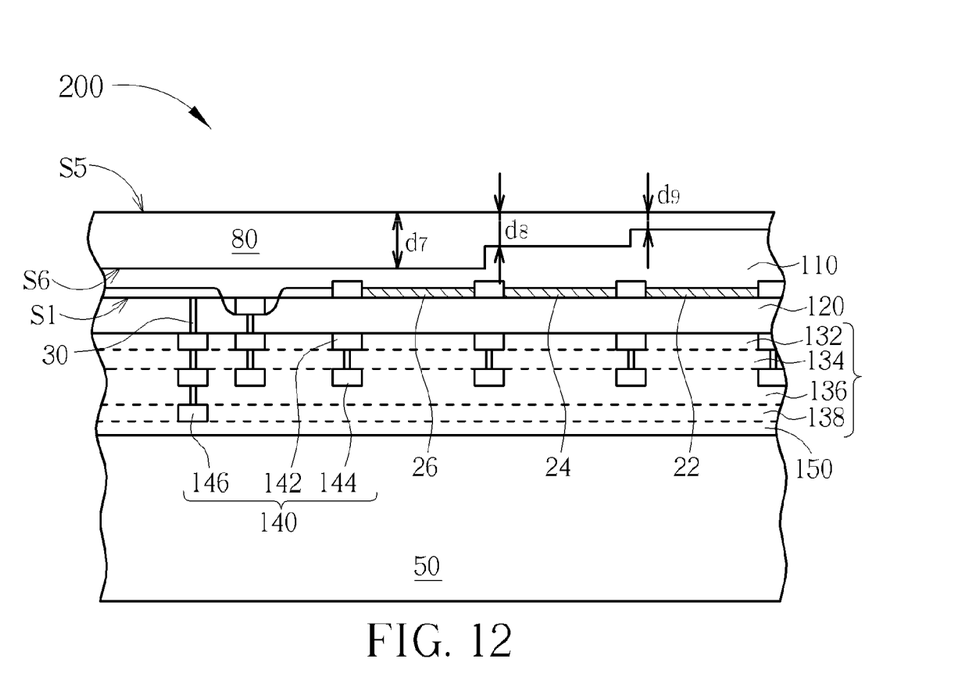

FIGS. 11-12 schematically depict cross-sectional views of an image sensing process according to a fourth embodiment of the present invention. The previous processing steps in this embodiment are the same as the processing steps of FIG. 1, but the doping process P1 may not be performed in this embodiment. As shown in FIG. 11, the substrate 110 is etched from the back side S2 to form at least a recess R1 and a recess R2 in the substrate 110, so that the substrate 110 has different thicknesses d4, d5, d6, wherein the etching method can be similar to the method for etching the anti-reflective layer 60, 60a in previous embodiments. For instance, a patterned photoresist (not shown) is formed to cover the substrate 110, thereby exposing a part of the substrate 112 while other parts of the substrate 110 are covered. An etching process is performed on the substrate 110, enabling apart of the substrate 112 to have a thickness d4. Then, a patterned photoresist (not shown) is formed to cover the substrate 110, thereby exposing apart of the substrate 112 while other parts of the substrate 110 are covered. An etching process is performed on the substrate 110, enabling a part of the substrate 114 to have a thickness d5. This means that the substrate 110 having the thicknesses d4, d5, d6 is formed, wherein the thickness d6 is larger than the thickness d5, and the thickness d5 is larger than the thickness d4. In addition, other etching processes may be performed to form the structure.

A doping process (not shown) may be selectively performed on the substrate 110. Then, as shown in FIG. 12, an anti-reflective layer 80 is formed to cover the substrate 110. The anti-reflective layer 80 may include a silicon nitride (SiN) layer, a silicon carbide (SiC) layer, a carbon-doped silicon nitride (SiCN) layer, a silicon oxynitride (SiON) layer or an organic material layer etc. More precisely, an anti-reflective layer (not shown) is formed to entirely cover the substrate 110, and then the anti-reflective layer (not shown) is selectively planarized to form the anti-reflective layer 80. By doing this, the anti-reflective layer 80 in this embodiment has a top surface S5 and a bottom surface S6, wherein the top surface S5 is a flat surface, and the bottom surface S6 of a part of the anti-reflective layer is a concave surface, so that the anti-reflective layer 80 has different thicknesses d7, d8, d9 wherein the thickness d7 is larger than the thickness d8, and the thickness d8 is larger than the thickness d9.

A plurality of color filters (not shown) is formed on the anti-reflective layer 80, and each of the color filters (not shown) respectively correspond to each of the photodiodes 22, 24, 26; a flat layer (not shown) may be selectively formed on each of the color filters (not shown); a microlens (not shown) may be selectively formed on each of the color filters (not shown) or the flat layer (not shown) to concentrate incident light emitting to each of the color filters (not shown). A passivation layer (not shown) may be selectively and respectively formed on each of the microlenses (not shown), and then other semiconductor processes such as external electrical connecting processes may be performed. This means that a back side illumination (BSI) image sensor 200 is formed.

Therefore, the anti-reflective layer 80 having different thicknesses can be formed in this embodiment, and each of the thicknesses correspond to different color filters (not shown) with different maximum intensity lights penetrating, thereby improving the anti-reflectivity of the anti-reflective layer 80. Moreover, the anti-reflective layer 80 in this embodiment has three thicknesses d7, d8, d9; however, in another embodiment, the anti-reflective layer may have two or four thicknesses, depending upon numbers, kinds, standards and performance of the color filters. The relation and the performances between the thicknesses of the anti-reflective layer 80 and the color filters (not shown) with different colors can be similar to the relation and the performances between the thicknesses of the anti-reflective layer 60, 60a and the color filters 70 with different colors in said embodiment, and are therefore not described again.

Above all, back side illumination (BSI) image sensors 100, 200 are formed in said embodiments, but the present invention can also be applied to other CMOS image sensors, such as front side illumination (FSI) image sensors, or to Charge-Couple Device (CCD). Even more, the present invention may also be applied in various devices using anti-reflective layers, such as Liquid Crystal On Silicon (LCOS) or liquid crystal display (LCD) etc to improve the anti-reflectivity of an anti-reflective layer.

To summarize, the present invention provides an image sensor and a process thereof, which forms an anti-reflective layer between a substrate and color filters, and parts of the anti-reflective layer corresponding to at least two of the color filters have different thicknesses. Therefore, the anti-reflective layer of the present invention, compared to an anti-reflective layer with a single thickness has better anti-reflectivity, thereby improving the optical transmission and the sensitivity of image sensors in specific wave bands. Moreover, the anti-reflective layer having different thicknesses has a top surface and a bottom surface, wherein the top surface may be a flat surface while a part of the bottom surface is a concave surface or the bottom surface may be a flat surface while a part of the top surface is a concave surface, so that an anti-reflective layer having different thicknesses can be formed. Preferably, the thicknesses of parts of the anti-reflective layer right below each of the color filters are optimal as being a quarter, three-quarters or five-quarters of the wavelength of the maximum intensity light of each of the color filters, so that the thicknesses of the parts of the anti-reflective layer right below at least one of the color filters are designed as a quarter, three-quarters or five-quarters of the wavelength of the maximum intensity light of each of the color filters in this embodiment, so as to achieve better anti-reflectivity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensor, comprising:
a plurality of color filters located on a substrate; and
an anti-reflective layer located between the substrate and the color filters and directly below the color filters, parts of the anti-reflective layer corresponding to at least two of the color filters having different thicknesses, wherein the bottom surfaces of the color filters are not coplanar.

2. The image sensor according to claim 1, wherein the anti-reflective layer comprises a silicon nitride (SiN) layer, a silicon carbide (SiC) layer, a carbon-doped silicon nitride (SiCN) layer, or a silicon oxynitride (SiON) layer.

3. The image sensor according to claim 1, wherein the anti-reflective layer has a top surface and a bottom surface.

4. The image sensor according to claim 3, wherein the top surface of the anti-reflective layer is a flat surface, and the bottom surface of part of the anti-reflective layer is a concave surface, so that the anti-reflective layer has different thicknesses.

5. The image sensor according to claim 3, wherein the bottom surface of the anti-reflective layer is a flat surface, and the top surface of part of the anti-reflective layer is a concave surface, so that the anti-reflective layer has different thicknesses.

6. The image sensor according to claim 1, wherein parts of the anti-reflective layer corresponding to each of the color filters have a thickness that is a quarter, three-quarters or five-quarters of the wavelength of the maximum intensity light penetrating the corresponding color filter.

7. The image sensor according to claim 6, wherein the color filters comprise a blue filter, a green filter and a red filter.

8. The image sensor according to claim 7, wherein the thickness of the part of the anti-reflective layer right below the blue filter is a quarter of the blue light wavelength, and the thickness of the part of the anti-reflective layer right below the green filter and the red filter is a quarter of the wavelength between the green light wavelength and the red light wavelength.

9. The image sensor according to claim 8, wherein the thickness of the part of the anti-reflective layer right below the green filter is a quarter of the green light wavelength, and the thickness of the part of the anti-reflective layer right below the red filter is a quarter of the red light wavelength.

10. The image sensor according to claim 1, wherein the image sensor comprises a CMOS image sensor.

11. The image sensor according to claim 1, wherein the CMOS image sensor comprises a Back Side Illumination (BSI) image sensor or a Front Side Illumination (FSI) image sensor.

12. An image sensing process, comprising:
   forming an anti-reflective layer on a substrate; and
   forming a plurality of color filters directly on the anti-reflective layer,
   wherein parts of the anti-reflective layer right below at least two of the color filters have different thicknesses, wherein the bottom surfaces of the color filters are not coplanar.

13. The image sensing process according to claim 12, wherein steps of forming the anti-reflective layer comprise:
   covering an anti-reflective layer on the substrate; and
   etching parts of the anti-reflective layer, enabling the anti-reflective layer to have at least two thicknesses.

14. The image sensing process according to claim 13, wherein the method for etching part of the anti-reflective layer comprises single or multi times etching processes to form the anti-reflective layer having two or more than two thicknesses.

15. The image sensing process according to claim 12, wherein steps of forming the anti-reflective layer comprise:
   etching a part of the substrate to form at least a recess in the substrate; and
   covering an anti-reflective layer on the substrate.

16. The image sensing process according to claim 12, wherein the anti-reflective layer comprises a silicon nitride (SiN) layer, a silicon carbide (SiC)layer, a carbon-doped silicon nitride (SiCN) layer, or a silicon oxynitride (SiON) layer.

17. The image sensing process according to claim 12, wherein parts of the anti-reflective layer right below at least one of the color filters have a thickness, which is a quarter, three-quarters or five-quarters of the wavelength of the maximum intensity light penetrating the corresponding color filter.

18. The image sensing process according to claim 17, wherein the color filters comprise a blue filter, a green filter and a red filter.

19. The image sensing process according to claim 18, wherein the thickness of the part of the anti-reflective layer right below the blue filter is a quarter of the blue light wavelength, and the thickness of the part of the anti-reflective layer right below the green filter and the red filter is a quarter of the wavelength between the green light wavelength and the red light wavelength.

20. The image sensing process according to claim 19, wherein the thickness of the part of the anti-reflective layer right below the green filter is a quarter of the green light wavelength, and the thickness of the part of the anti-reflective layer right below the red filter is a quarter of the red light wavelength.

* * * * *